(12) United States Patent
Fredeman et al.

(10) Patent No.: US 7,085,180 B2
(45) Date of Patent: Aug. 1, 2006

(54) METHOD AND STRUCTURE FOR ENABLING A REDUNDANCY ALLOCATION DURING A MULTI-BANK OPERATION

(75) Inventors: Gregory J. Fredeman, Staatsburg, NY (US); Mark D. Jacunski, Colchester, VT (US); Toshiaki Kirihata, Poughkeepsie, NY (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 10/777,596

(22) Filed: Feb. 12, 2004

(65) Prior Publication Data

US 2005/0180230 A1    Aug. 18, 2005

(51) Int. Cl.
*G11C 29/00*   (2006.01)
*G11C 7/00*    (2006.01)

(52) U.S. Cl. ............... 365/200; 365/201; 365/230.03; 365/189.07

(58) Field of Classification Search ............. 365/200, 365/201, 210, 230.03, 230.06, 230.08, 189.07
See application file for complete search history.

(56) References Cited

U.S. PATENT DOCUMENTS

| | | | |
|---|---|---|---|
| 5,293,348 A * | 3/1994 | Abe ................... 365/230.03 |
| 5,448,523 A * | 9/1995 | Lewis et al. ........... 365/189.07 |
| 6,320,800 B1 * | 11/2001 | Saito et al. ............. 365/200 |
| 6,388,929 B1 * | 5/2002 | Shimano et al. ......... 365/201 |
| 6,707,733 B1 * | 3/2004 | Taura et al. ............ 365/200 |
| 6,757,852 B1 * | 6/2004 | Ghassemi et al. ........ 714/711 |
| 6,895,537 B1 * | 5/2005 | Kawagoe et al. ......... 365/200 |

\* cited by examiner

*Primary Examiner*—Huan Hoang
(74) *Attorney, Agent, or Firm*—H. Daniel Schnurmann

(57) ABSTRACT

A method for allocating redundancies during a multi-bank operation in a memory device which includes two or more redundancy domains is described. The method includes steps of enabling a pass/fail bit detection to activate a given bank. The pass/fail bit detection is prompted only for a selected domain and is disabled when it addresses other domains. By altering the domain selection, it is possible to enable a redundancy allocation for any domain regardless of the multi-bank operation. The method may preferably be realized by using a dynamic exclusive-OR logic with true and complement expected data pairs. When combined with simple pointer logic, the selection of domains may be generated internally, simplifying the built in self-test and other test control protocols, while at the same time tracking those that fail.

19 Claims, 6 Drawing Sheets

METHOD AND STRUCTURE FOR ENABLING A REDUNDANCY ALLOCATION DURING A MULTI-BANK OPERATION

BACKGROUND OF THE INVENTION

This invention is generally related to an embedded dynamic random access memory (embedded DRAM), and more particularly, to a structure and a method for providing an in-macro redundancy allocation during a multi-bank operation by sampling a pass/fail detection.

Improvements in semiconductor technology have enabled processors to operate at a frequency exceeding 1 Giga Hz. However, the processor performance is often limited by the performance of its memory. This has created a potential strong demand for high performance embedded Dynamic Random Access Memories (DRAMs) to match the processor speed. Embedded DRAMs, however, require a write back operation when accessing a memory cell, which slows the random access cycle time when compared to an embedded SRAM lacking the write-back operation. This drawback is typically overcome by a multi-bank operation.

FIG. 1 shows a schematic block diagram that illustrates the architecture of a conventional DRAM device. DRAM 100 consists of a plurality of memory arrays 110, each array consisting of a plurality of memory cells 120 arranged in a matrix. The memory cells in the array are supported by a plurality of wordlines 130 and bitlines 140. The cells in the memory array are accessed by activating wordline 130. When the wordline, e.g., in array 110A is energized, the data bits in all the cells 120 coupled to, e.g., wordline 130 are read out to bitlines 140. The read data bits are then amplified by a sense amplifier (not shown) enabling the bits to be read out to datalines 150 by coupling bitlines 140 to data lines 150 by way of switches 142. Datalines 150 are typically arranged throughout the arrays 110, enabling data to be read from or written to any of the arrays 110. The data bits read out from the memory cells are subsequently written back to the cells 120 by making use of the bitline swing resulting from a sensing operation, since data in the cell data is destroyed when wordline 130 is activated (i.e., destructive read and write back operations). Memory array 110A remains active as long as the write back operation is in progress. The memory access cycle time is limited by destructive read out and write back operations, which will be referred to hereinafter as the random access cycle time. During a memory access operation in memory array 110A, other memory arrays, such as 110B, may initiate a memory access operation. By staggering the n memory array accesses during the random access cycle time, the data rate improves by a factor n times the data rate of the individual memory array. The cycle time in the aforementioned multi-bank operation is referred to as a bank-to-bank access cycle time.

Multi-bank operations create a problem when allocating redundancies in situations where the memory arrays during a multi-bank operation consist of two or more domains, which will be explained hereinafter. By way of example, memory array 110A is provided with a row redundancy 130R that repairs a fail occurring in memory array 110A (to be referred as domain A). Similarly, memory array 110B includes a row redundancy 130R that repairs a fail in memory array 110B (to be referred as domain B). Note that the redundancy replacement for memories 110A and B (domains A and B) differ from one another.

During a multi-bank test operation, a fail detected by the redundancy allocation logic will be 'seen' in two domains when the memory arrays (110A and 110B) that are supported by the two domains A and B are addressed. This makes it difficult to assign a redundancy replacement using redundancy allocation logic, unless the redundancy allocation logic has a function that identifies the domain for each detected fail. Because the multi-bank typically operates in the range of 500 MHz, enabling this function becomes very difficult.

Handling of the redundancy allocations during a multi-bank operation having two or more domains is complicated by the fact that the redundancy allocation needs to be completed within the bank-to-bank-access cycle time. Typically, the redundancy allocation, particularly when assigning a row redundancy requires the use of OR logic, which is inherently slow and which significantly exceeds the bank-to-bank-access cycle time. A pipeline architecture commonly used for a processor may improve the speed of the redundancy allocation logic by dividing a redundancy allocation cycle into many small pipeline cycles to support several bank allocations. However, this is a complex and expensive process. Therefore, the existing redundancy allocation logic, applicable to a conventional embedded DRAM prohibits a multi-bank operation when the redundancy allocation takes place, in which only one bank is allocated at a time. However, this is not a precondition set for the application and, therefore, it is not an ideal solution for high speed multi-bank operations.

OBJECTS AND SUMMARY OF THE INVENTION

Accordingly, it is an object of the invention to provide a redundancy allocation during a multi-bank operation for macros having two or more redundancy domains.

It is another object to provide a redundancy allocation during a multi-bank operation by sampling pass/fail detection, preferably by way of a control signal.

It is yet another object to provide a redundancy allocation during a multi-bank operation to enable a redundancy allocation only when a predetermined bank is addressed.

It is a further object to provide a redundancy allocation in a multi-bank operation without resorting to a pipeline configuration.

It is a still another object to enable a redundancy allocation by integrating a simple pointer logic, wherein the selection of the domains is internally controlled.

It is yet a further object to reduce the redundancy allocation speed requirement by sampling a pass/fail detection period.

This invention describes a method that enables an in-macro redundancy allocation for a predetermined bank during a multi-bank operation that includes a plurality of domains. The in-macro redundancy allocation is enabled by sampling a pass/fail bit detection. More particularly, the sampling method includes a step to enable or disable the pass/fail bit detection at which the corresponding bank is activated. This allows the pass/fail bit detection to become available only for the selected domain while disabling the pass/fail bit detection when other domains are addressed during the multi-bank operation. The speed requirement of the redundancy allocation logic is reduced by the sampling period, because the frequency of the redundancy allocation logic need be no greater than the sampling rate. No pipeline is necessary, allowing a simple redundancy allocation for the multi-bank operation.

The inventive method preferably utilizes a dynamic logic in the pass/fail bit detection logic, which retains the detection result until the next enable signal is issued.

In another aspect of the invention, there is provided a semiconductor memory that supports a multi-bank memory operation, wherein the multi-bank operation merges the redundancy allocation logic by integrating a simple pointer logic, the selection of the domains being internally enabled which, in turn, simplifies the BIST (Built-in Self Test) or the tester control protocols, while tracking the failed addresses during the multi-bank operation.

The present invention provides a memory device configured to perform multi-bank operations that includes: a plurality of memory banks including at least a first and second memory bank respectively controlled by a first and a second redundancy replacement means; and means for comparing data bits read out the first memory bank against corresponding expected data, the comparison occurring only when the first bank is addressed during a multi-bank operation.

The invention further provides second means for comparing the data bits read out of the second memory bank against corresponding expected data, the comparison occurring only when the second bank is addressed during a multi-bank operation.

Still provided is a memory device configured to perform multi-bank operations that includes: a plurality of memory banks wherein at least two banks are supported by separate redundancy replacement means; identifying means for identifying one bank of the plurality of memory banks; a comparison means; enabling means for enabling at least two of the banks in a multi-bank mode, for accepting expected data, and for generating an enable signal, wherein the enabling means enables the comparison means to detect if data bits read from one of the bank matches its expected data only when the identification means identifies the corresponding bank during the multi-bank operation.

Also provided is a method for allocating a redundancy in a memory device configured for a multi-bank operation that includes the steps of: a) sub-dividing the memory device into a plurality of memory banks, wherein at least two banks are supported by different redundancy replacement means; enabling at least two banks in a multi-bank mode; identifying the redundancy domain during the multi-bank mode and accepting expected data; and enabling a data comparison of data bits read from one of the banks and matching the data bits to corresponding expected data only when the bank is identified and addressed during the multi-bank operation.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below, serve to explain the principles of the invention.

DETAILED DESCRIPTION OF THE INVENTION

Figure 1:
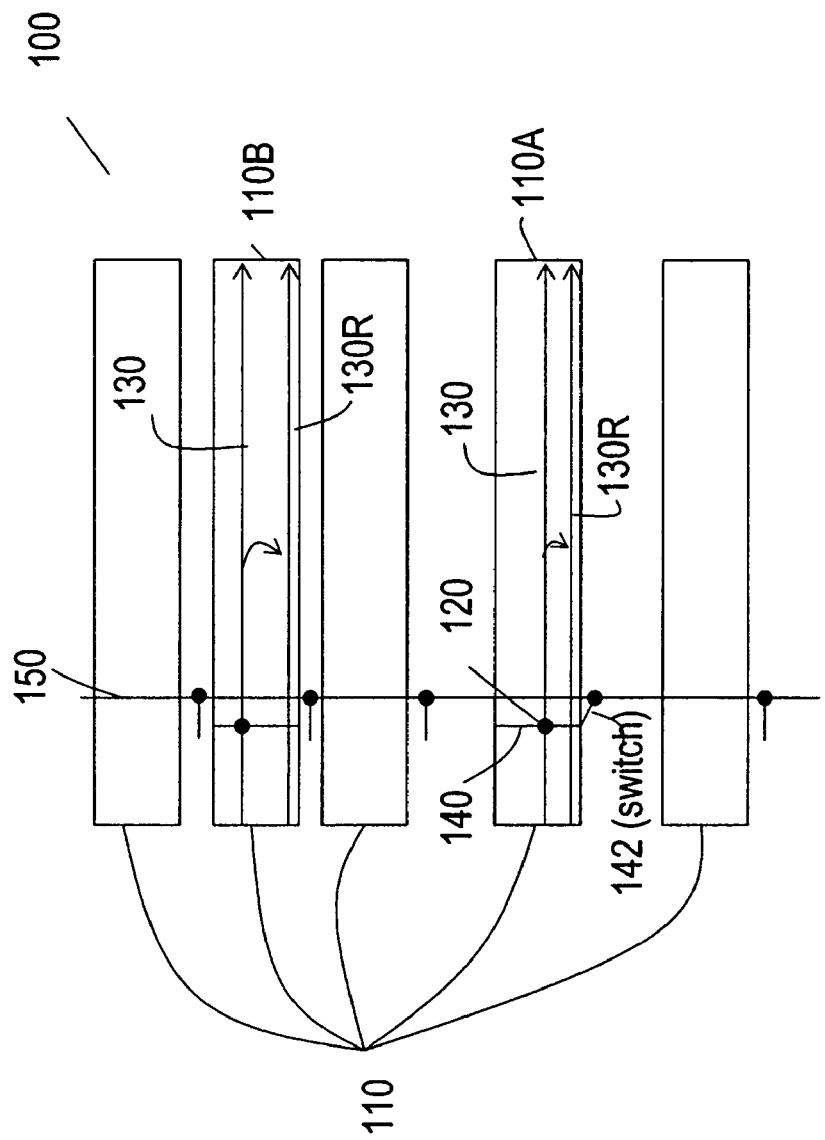
FIG. 1 shows a block diagram representing a conventional multi-bank memory supporting a multi-bank operation.
Figure 2:
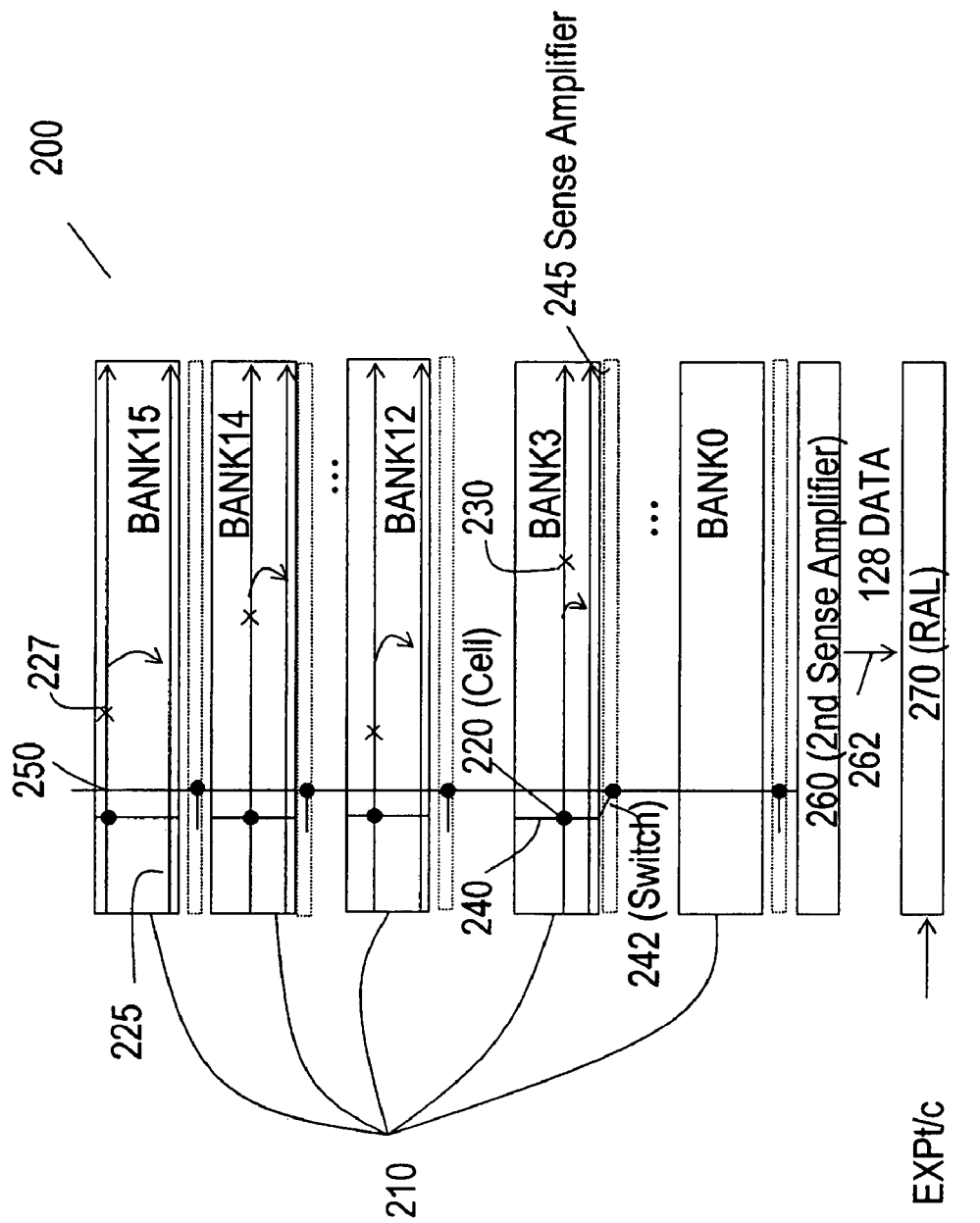
FIG. 2 shows a block diagram representing a multi-bank memory supporting the redundancy allocation during a multi-bank operation.

Referring now to FIG. 2, there is shown a memory architecture designed to support multi-bank operations. Memory macro (IC or chip) 200 consists of 16 memory arrays 210. Each memory array 210 is a bank consisting of 128 Kb memory cells 220 arranged by a 128 by 1024 matrix. The 128 by 1024 memory cells are supported by 128 wordlines 230 and 1024 bitline pairs 240, resulting in a 2 Mb memory device divided into 16 banks. When, e.g., memory bank BANK3 is addressed, one of 128 wordlines in BANK3 is activated, allowing 1024 bits to be read onto the 1024 bitline pairs, and amplified by 1024 sense amplifiers 245. As discussed in the Background of the Invention, the memory bank BANK3 remains active typically for at least 5 ns, while performing a destructive read out and write back operation. In a multi-bank mode, however, other banks may be activated every 1.25 ns, allowing a total of four memory banks to become active during the 5 ns time period.

By way of example, memory banks (BANK3, BANK12, BANK14, and BANK15) may be activated sequentially at every 1.25 ns clock edge. Sense amplifiers 245 include 1 to 8 multiplexing switches 242 such that 128 data bits are transferred from 1024 bitline pairs to the 128 datalines 250. Datalines 250 are arranged over the 16 memory banks, making it possible to transfer data bits from any of the memory banks BANK0–15. The data bits on the datalines are sensed by 128 second sense amplifiers 260, and read-out from the memory output ports 262. Although each activated array remains active for at least 5 ns, the data bits in the activated four memory banks 210 are sequentially transferred to the dataline 250 at each 1.25 ns clock edge. A write mode operation follows a similar signal path from 128 input ports (not shown), 128 write datalines (not shown), and 1024 bitlines 240 in the corresponding memory bank.

For simplicity, the architecture includes only a one row redundancy, which may be easily be expanded to include additional row and/or column redundancies. Each memory bank is provided with a row redundancy 225. Fail 227 (depicted by the letter 'X') is therefore repaired by way of the corresponding row redundancy 225 within the bank. (It is worth noting that row redundancy 225 within the bank services only the corresponding memory array, at the exclusion of any other array within the memory macro). Accordingly, memory 200, consisting of a plurality of banks, i.e., domains, includes a redundancy allocation logic RAL 270, which is preferably placed at the bottom of the memory, and which is coupled to 128 data output ports 262. For simplicity, in the present example, it is assumed that all the data bits read-out from data ports 262 are the same. RAL 270 is therefore connected to a single expected data input port true and complement pair EXPt and EXPc, hereinafter referred to EXPt/c. By increasing the number of expected data pairs, any data pattern may be supported. A typical example allocates two sets of expected data pairs to support the even and odd circuitry, which is well known in the art and which, therefore, will not be discussed further.

Figure 3:
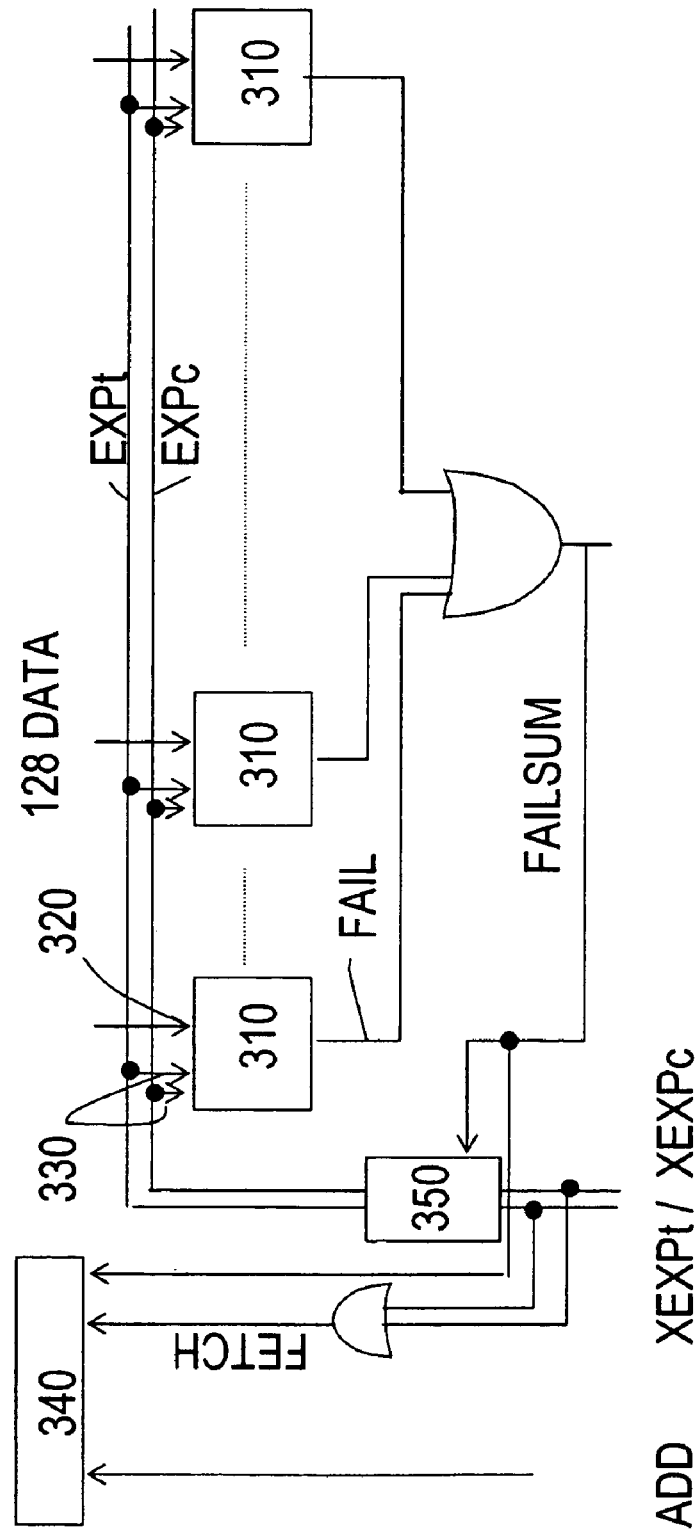
FIG. 3 illustrates a first preferred embodiment of the invention showing a detailed block diagram of the redundancy allocation logic which supports the redundancy allocation during a multi-bank operation.

FIG. 3 shows the details of redundancy allocation logic (RAL) 270. It includes a sampling function to enable the pass/fail detection only for a predetermined time. More particularly, the pass/fail detection is enabled only if external expected data XEXPt or XEXPc switches to high, at which time a read command is prompted. If both signals are at low, the detection circuit is not enabled altogether. Therefore, the previous detection result remains unchanged. By utilizing this feature, the pass/fail detection is enabled only when a predetermined memory bank is addressed during the multi-bank operation, at which time the result is stored. This reduces the speed requirements for RAL, allowing it to operate as slow as the time dictated by the sampling rate. Details of the operation follow hereinafter.

RAL accepts signals XEXPt and XEXPc, at which time a read command (not shown) is issued. Address inputs ADD are fetched at the failed address register 340 if either XEXPt or XEXPc switches to high. The signals XEXPt and XEXPc are delayed by delay element 350 for a predetermined read latency, generating an internal expected data pair EXPt and EXPc (330). RAL 270 includes 128 pass/fail detection circuits 310, each of which is coupled to the corresponding data output 320 and to the EXPt and EXPc pair 330. The detection circuit 310 activates a signal FAIL (i.e., making FAIL switch to high) only if the data bit DATA from memory and the expected data (EXPt/EXPc) does not match when detection is enabled. The 128 FAIL results are ORed, generating an output signal FAILSUM. Therefore, if a fail occurs in any of the 128 memory cells, signal FAILSUM switches to high. This disables any future detection and address fetches. Typically, OR logic requires more than one bank-to-bank cycle time of 1.25 ns. The present invention offers the advantage of disabling future comparisons and maintaining the result unchanged. This feature is essential to the invention since it eliminates the need for pipeline logic for the RAL circuitry. Sampling (or detection) period can be extended to a random access cycle time, e.g., 5 ns, in the present example. The test may be continued or disabled by using the result showing at FAILSUM. As long as XEXPt/XEXPc remain at low, wherein a read command is issued, the address and FAILSUM remain unchanged. Optionally, the period for enabling XEXPt/XEXPc may be extended in order not to initiate the next comparison and address fetch operations prior to receiving the result determined by FAILSUM. The address stored in register 340 becomes, therefore, the address of the row redundancy replacement for the corresponding memory bank. By utilizing this configuration and mode of operation, the redundancy allocation for all memory banks can be realized one by one. To select a tested domain, the time for the expected data pairs is changed to enable a comparison only to the selected bank during the multi-bank operation. No pipeline operation is therefore necessary in RAL since the detection circuit 310 retains the results until a subsequent detection command is issued by switching either EXPt or EXPc to high.

Figure 4:
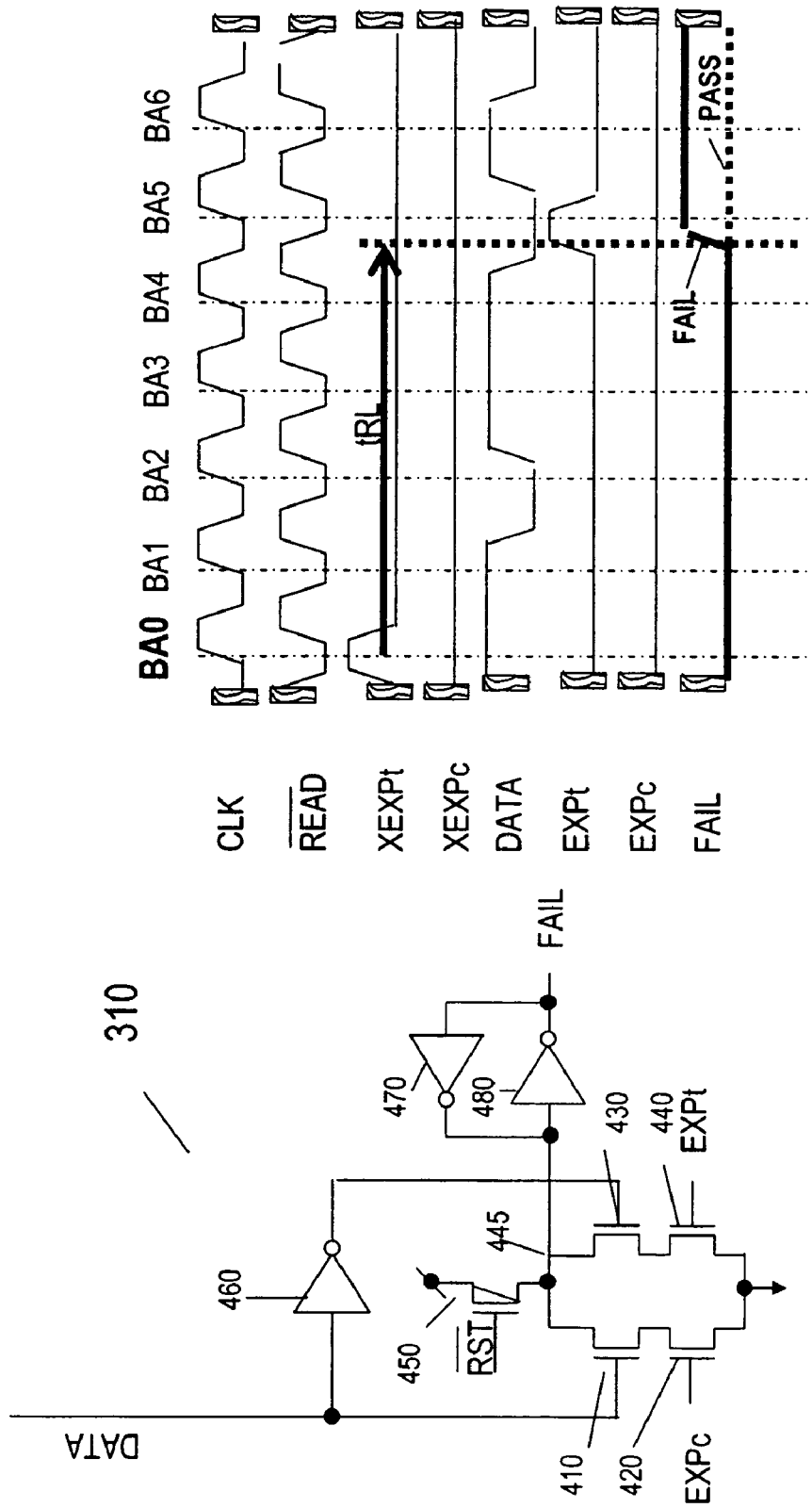
FIG. 4 illustrates a pass/fail detection transistor level schematic diagram that utilizes dynamic logic and sampling logic with true and complement expected data.

FIG. 4 shows a detailed schematic of the pass/fail detection circuit 310 and its corresponding timing diagram. As previously discussed with reference to FIGS. 2 and 3, memory macro 200 accepts the true and complement expected data (XEXPt and XEXPc) when the read command is issued. Address bits (ADD) are stored in the register, at which time XEXPt and XEXPC switch to high. The expected data pair (XEXPt and XEXPc) is delayed to allow matching the data bit latency from the memory array. The delayed signals EXPt and EXPc are compared to DATA generated within the memory array by way of a dynamic exclusive-OR logic. The exclusive-OR logic consists of a first series of NMOS formed by NMOSs 410 and 420, and a second series formed by NMOSs 430 and 440. The sources of NMOSs 420 and 440 are coupled to GND, and the drains of NMOSs 410 and 440 to node 445. Node 445 is precharged to VDD through PMOS 440. The precharged node 445 is latched by two invertors 470 and 480, generating the FAIL signal. As long as EXPt and EXPc are both at low, NMOSs 420 and 440 remain off. Therefore, the precharged node 445 retains FAIL at low which, in turn, disables a comparison for the unselected domains, retaining the steady state condition required to maintain both EXPt and EXPc signals at low. To enable detection, either EXPt or EXPc switches to high. If a match for the expected data occurs, the precharged node 445 remains at high, because at least one NMOS of the first series of NMOSs and one NMOS of the second series are off. Therefore, the signal FAIL remains at low. If no match occurs, either the first or the second series discharges node 445 to low. Thus, the signal FAIL switches to high after a predetermined latency, disabling any future detection. The resulting FAIL signal is retained until the reset signal Not RST switches to low. Generating the signal Not RST is realized by having detecting signals EXPc and EXPt switch to high, making it possible to retain the result FAIL until a subsequent detection is requested. This reduces the speed of the RAL operation since the detection frequency of RAL is also reduced.

Note that RAL tests for a fail and allocates redundancy only when EXPt or EXPC switch to high. Otherwise it holds the results previously detected. The period when either EXPt or EXPC switch to high is defined by the detection sampling rate of RAL. By way of example, for a four bank multi-bank operation of 800 MHz, EXPt or EXPc switch to high every 5 ns, reducing the speed of the RAL operation to 200 MHZ during an 800 MHz multi-bank operation. Because 200 MHz (i.e., 5 ns cycle) is sufficiently long, no pipeline is necessary. If it is still insufficient, the operational speed of RAL can be further extended by further multiplying the sampling period, if required.

Thus far, the expected data pairs are controlled by external signals XEXPt and XEXPc, shown in FIG. 3. However, they may also be generated locally by utilizing the expected data port corresponding to the data bit, and/or a common detection enabling port for multiple or for all the data bits.

Figure 5:
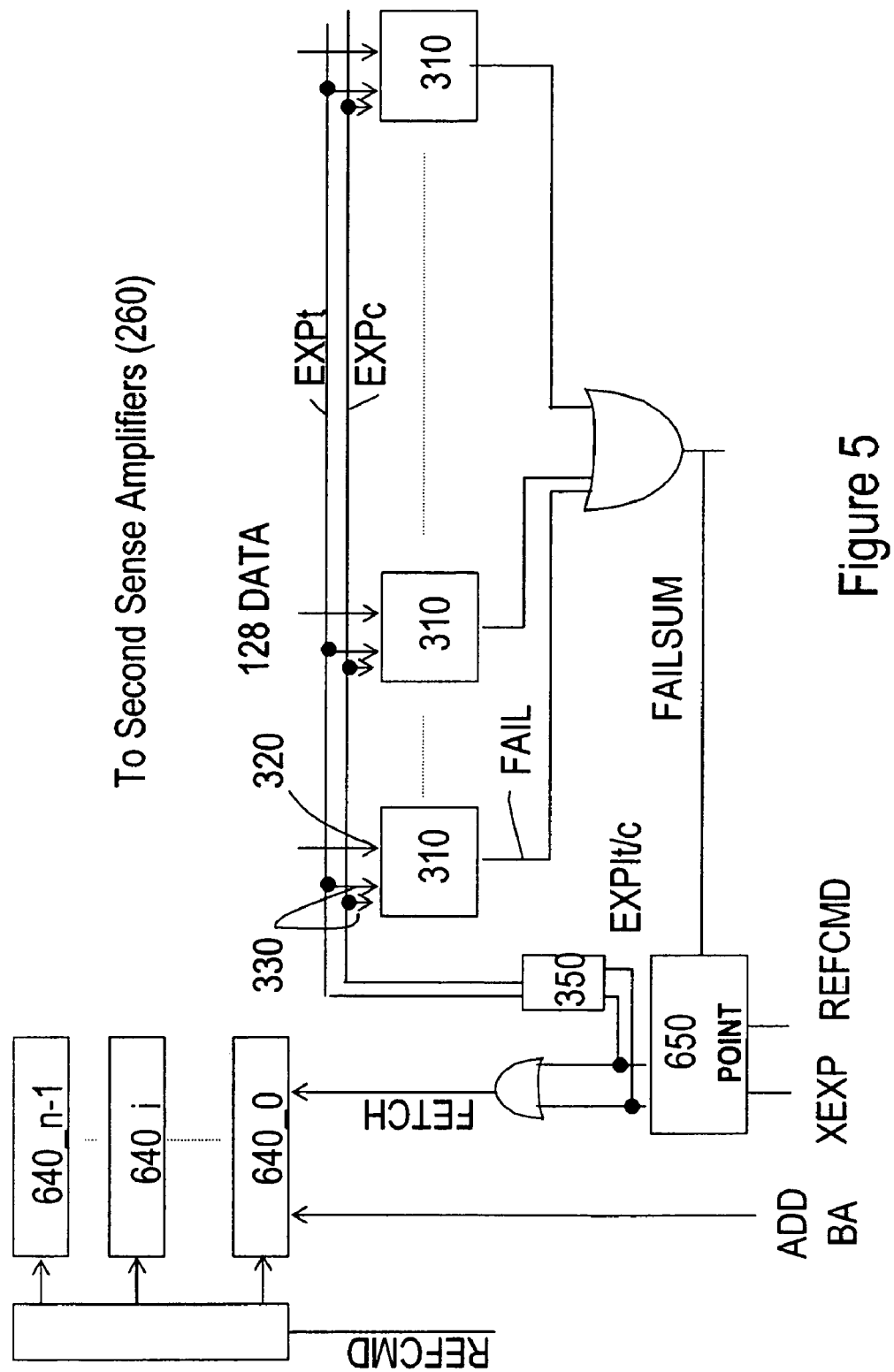
FIG. 5 illustrates a second preferred embodiment of the invention showing a detailed block diagram of the redundancy allocation logic which supports the redundancy allocation for a multi-bank operation by way of pointer generation logic.
Figure 6:
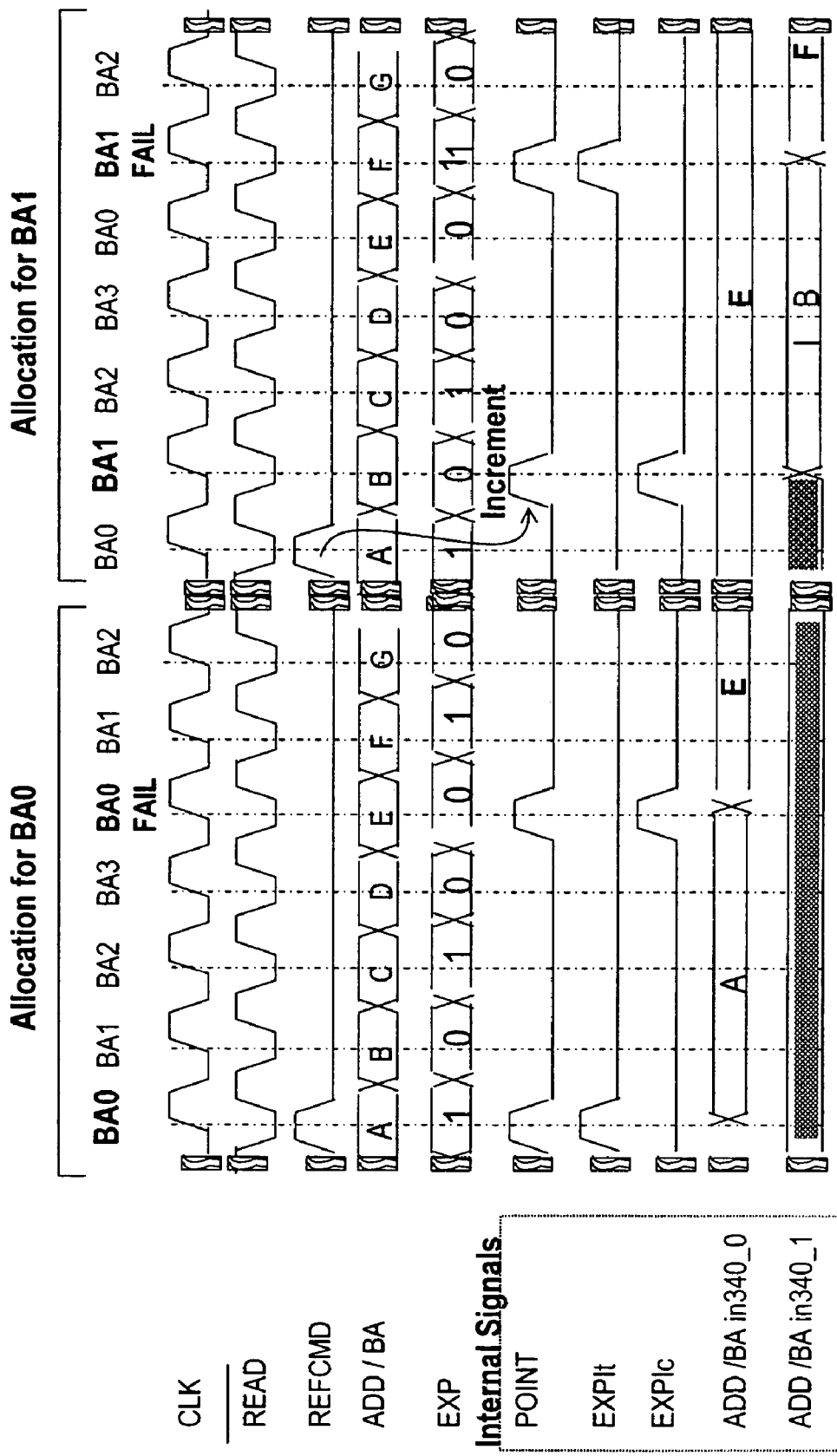
FIG. 6 illustrates a detailed timing diagram corresponding to the second preferred embodiment of the invention.

The invention further integrates more sophisticated algorithms by utilizing additional failed address generators and local expect data pattern generators. FIGS. 5–6 show, respectively, a block diagram and the corresponding timing diagram to achieve a redundancy allocation by just repairing the same number of addressing patterns as the number n of multi-banks. Unlike the previous example, the method includes n failed address registers, 640_0, . . . , 640_(n–1), each supporting the corresponding memory bank BANKi (not shown). Similar to the previous example, the macro receives the expected data (XEXP) at which time the read command is issued. The true and complement expected data (EXPIt/c), however, are locally generated by a local expected data pattern generator (650) for multi-bank operation. The number n of bits may be programmed, a fact that is well known and which, therefore, will not be discussed. Furthermore, circuit 650 generates EXPIt/c to successfully identify the bank to be tested. The identification is realized by a pointer and a counter in circuit 650 which counts from the initial read command, where the pointer determines the detection sampling rate. Assuming the pointer having n-bits and a detection sampling period of n cycles suited for an n-bank multi-bank operation, then, the first read command is advantageously determined by a reference command REFCMD. It is assumed that the pointer in circuit 650 is set to 0 before initiating the operation. It is also assumed that the counter enables EXPIt/c every n read command clock cycles from the first read command pulse, the latency being defined by the pointer. More specifically, the first read command is defined by reference command signal REFCMD, at which time the read command is issued. Alternatively, REFCMD may be independently activated prior to the read command that identifies the next read command as the first read command. When this read command is prompted, circuit 650 instantly generates EXPIt/c, since the pointer identifies a 0. EXPIt/c is coupled to delay element 350 (similar to the first embodiment of the invention), allowing a pass/fail detection by way of circuit 310. Circuits 310 are then ORed, generating signal FAILSUM only when one of the circuits 310 detects a fail. For the following n−1 read cycles, circuit 650 disables the EXPIt/c generation. The fail/pass results are held in each detection circuit 310, allowing sufficient time for generating FAILSUM. The result FAILSUM is kept until the next subsequent detection is enabled. This procedure realizes the true and complement expected data pair only when the first bank is addressed during n multi-bank operations, with RAL fetching the address bits as well as the bank address bits to the corresponding register 640 (i.e. 640_0) identified by the pointer at which time either the true or complement locally generated expected data EXPIt/c switches to high. If RAL detects a fail, the comparison is inhibited until the next reference command REFCMD. The pointer shifts when the next reference command REFCMD is issued, which increments the pointer by 1 bit (POINTER=1), identifying the latency of 1 to generate EXPIt/c. This allows the second bank during the multi-bank operation to be tested. Note that the external address and command protocol are exactly same as for the first bank allocation. This operation, replicated n times, successfully allocates a redundancy to all the banks by just repeating the same address patterns as many as n times for an n multi-bank operation.

In conclusion, the second embodiment allocates a redundancy for n multi-bank operations by applying the same addressing pattern n times. RAL automatically identifies the bank with the local expected data generator 650, allocating a redundancy one by one by way of pass/fail detection circuit 310, while keeping the redundancy address in address latches 640.

While the invention has been discussed in terms of several preferred embodiments, various alternative and modifications can be devised by those skilled in the art without departing from the invention. Accordingly, the present invention is intended to embrace all such alternatives which fall within the scope of the appended claims.

What is claimed is:

1. A memory device configured to perform multi-bank operations comprising a plurality of memory banks including at least a first and second memory bank respectively controlled by a first and a second redundancy replacement means, said memory device comprising:
   a redundancy allocation means for allocating redundancy elements by way of performing a comparison of data bits read out from said first memory bank against corresponding expected data, said data bit comparison occurring only when said first bank is addressed during a multi-bank operation, said comparison being performed by a dynamic exclusive OR circuit comprising:
   a first transistor having a gate, source, and drain respectively coupled to said data to a first node and to a second node,
   a second transistor having a gate, source, and drain respectively coupled to the complement of said expected data, to a first voltage source, and to said first node;
   a third transistor having a gate, source, and drain respectively coupled to the complement of said data, to a third node, and to said second node, and
   a fourth transistor having a gate, source, and drain respectively coupled to said expected data, to said first voltage source, and to said third node, such that said second node follows said first voltage source only if no match of said data to said expected data occurs.

2. The memory device recited in claim 1, further comprising second means for comparing the data bits read out of said second memory bank against corresponding expected data, said comparison occurring only when said second bank is addressed during a multi-bank operation.

3. The memory device recited in claim 2, wherein a period of said comparison is longer than the bank-to-bank access cycle time of said multi-bank operation.

4. The memory device recited in claim 2, wherein a selection means selects either the first or the second bank to perform said comparison, and wherein said comparison is enabled only when the selected bank is addressed.

5. The method device as recited in claim 1 wherein said expected data is provided when prompted by a read command, said read command being delayed by a predetermined read latency.

6. The memory device as recited in claim 1, wherein said expected data and the complement thereof remain at low until comparison means is enabled, and either of said expected data and complement thereof switches to high when said comparison means is enabled.

7. The memory device as recited in claim 1, wherein said expected data and the complement of said expected data are generated by a single expected data and an enabling signal.

8. The memory device as recited in claim 1 further comprising a fifth transistor having a gate, source and drain respectively coupled to a line carrying a first signal to said second voltage source, and to said second node, wherein said second node is precharged to said second voltage prior to performing said data comparison by controlling said first signal.

9. The memory device as recited in claim 8, wherein the detection result of said second node is held until said first signal precharges said second node.

10. The memory device as recited in claim 9, further comprising:
   at least one second circuit to enable a data comparison for a different data bit, and
   means for OR'ing all said data comparison circuits, wherein a fail is identified by one of said data comparison circuits.

11. The memory device as recited in claim 1, wherein a time required for allocating a redundancy during a multi-bank operation exceeds the bank-to-bank clock cycle.

12. The memory device as recited in claim 1, wherein a time required for allocating a redundancy to a predetermined domain during a multi-bank operation extends over one random access cycle.

13. The memory device as recited in claim 1 further comprising means for fetching address bits only when comparing means compares data bits read out from said memory bank against corresponding expected data.

14. A method for allocating a redundancy in a memory device configured for a multi-bank operation, comprising the steps of:
   sub-dividing said memory device into a plurality of memory banks, wherein at least two banks are supported by different redundancy replacement means;
   enabling said at least two banks in a multi-bank mode;
   identifying said redundancy domain during the multi-bank mode and accepting expected data; and
   enabling a data comparison of data bits read from one of said banks and matching said data bits to corresponding expected data only when said bank is identified and addressed during said multi-bank operation, wherein
   enabling said data comparison is performed by a dynamic exclusive-OR circuit, said dynamic exclusive-OR circuit comprising:
   a first transistor having a gate, source, and drain respectively coupled to data, to a first nod; and to a second node;
   a second transistor having a gate, source, and drain respectively coupled to the complement of said expected data, to a first voltage source, and to said first node;
   a third transistor having a gate, source, and drain respectively coupled to the complement of said data, to a third node, and to said second node; and
   a fourth transistor having a gate, source, and drain respectively coupled to said expected data, to said first voltage source, and to said third node, such that said second node follows said first voltage source only if no match of said data to said expected data occurs.

15. The method recited in claim 14 further comprising a fifth transistor having a gate, source and drain respectively coupled to a line carrying a first signal, to said second voltage source, and to said second node, wherein said second node is precharged to said second voltage prior to performing said data comparison by controlling said first signal.

16. The method recited in claim 14, further comprising the step of maintaining the detection result of said second node from the initial time when said data comparison is enabled to a time when said first signal precharges said second node.

17. The method recited in claim 14, wherein a time required for the allocation of a redundancy during a multi-bank operation exceeds a bank-to-bank clock cycle.

18. The method recited in claim 14, wherein a time required for the allocation of a redundancy during a multi-bank operation extends over one random access cycle to allocate the redundancy for a predetermined domain.

19. The method recited in claim 14, further comprising the step of fetching address bits only when the redundancy allocation enables or disables a pass or a fail bit detection to fetch the address bits only when the bank is identified and addressed during the multi-bank operation.

* * * * *